(12) United States Patent
Nagai et al.

(10) Patent No.: US 7,745,895 B2
(45) Date of Patent: *Jun. 29, 2010

(54) SEMICONDUCTOR LIGHT EMITTING DEVICE

(75) Inventors: Youichi Nagai, Osaka (JP); Yasuhiro Iguchi, Osaka (JP); Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 364 days.

This patent is subject to a terminal disclaimer.

(21) Appl. No.: 11/567,931

(22) Filed: Dec. 7, 2006

(65) Prior Publication Data

US 2007/0138490 A1 Jun. 21, 2007

(30) Foreign Application Priority Data

Dec. 14, 2005 (JP) ............................. 2005-360862

(51) Int. Cl.
*H01L 31/0232* (2006.01)
*H01L 31/14* (2006.01)

(52) U.S. Cl. .................. 257/432; 257/460; 257/461; 257/80; 257/184; 257/434; 257/E31.123; 257/E31.127; 257/E33.076

(58) Field of Classification Search .............. 257/80, 257/82, 94, 98, 104, 184, 233, 431, 459, 257/461, 432, 435, 460, E31.123, E31.127, 257/E33.076
See application file for complete search history.

(56) References Cited

U.S. PATENT DOCUMENTS 4,885,622 A * 12/1989 Uchiyama et al. ............ 257/53
6,399,968 B2 * 6/2002 Kato et al. ................... 257/184
6,476,410 B2 * 11/2002 Ishinaga ....................... 257/13
6,521,968 B2 * 2/2003 Kuhara et al. ............... 257/461
6,835,990 B2 * 12/2004 Iguchi et al. ................ 257/435
7,544,975 B2 * 6/2009 Inada .......................... 257/184
2003/0102496 A1 * 6/2003 Kuhara et al. ............... 257/233
2006/0273421 A1 * 12/2006 Yasuoka et al. ............. 257/438
2007/0001254 A1 * 1/2007 Inada .......................... 257/461

FOREIGN PATENT DOCUMENTS

JP 08-116127 5/1996
JP 10-074972 3/1998

\* cited by examiner

*Primary Examiner*—Jerome Jackson, Jr.
*Assistant Examiner*—Yu Chen
(74) *Attorney, Agent, or Firm*—Fish & Richardson P.C.

(57) ABSTRACT

The present invention provides a semiconductor light emitting device capable of easily realizing stable output characteristics within a wide temperature range. The semiconductor light emitting device includes a semiconductor laser element, and a semiconductor photodiode having an absorption layer disposed on a semiconductor substrate, a second conductivity type region formed in a cap layer and the absorption layer, and a transmissive reflection film disposed on the back side of the semiconductor substrate. The semiconductor photodiode is mounted with the epitaxial layer side down, and the transmissive reflection film is irradiated with a laser beam emitted from the semiconductor laser element so that light reflected from the transmissive reflection film is used as output light, and transmitted light is received by the semiconductor photodiode and used for controlling the output of the semiconductor laser element.

12 Claims, 14 Drawing Sheets

SEMICONDUCTOR LIGHT EMITTING DEVICE

BACKGROUND OF THE INVENTION

1. Field of the Invention

The present invention relates to a semiconductor light emitting device and more specifically relates to a semiconductor light emitting device capable of controlling optical output with high accuracy by monitoring the optical output.

2. Description of the Related Art

As light sources for optical communication, semiconductor light emitting devices having stable output characteristics within a wide temperature range have been required. In general, semiconductor lasers (laser diode LD) are used, and a LD is provided with an alignment mechanism for optical output so that optical output is little affected by temperature variations and other disturbances.

For example, a semiconductor light emitting device using the following alignment mechanism has been proposed. Front optical output of a LD is output to the optical fiber side, and rear optical output is received by a photodiode (PD) used as a light receiving element which functions as a monitor. In addition, a monitor current is generated according to the quantity of light received by the PD to adjust a LD driving current and control LD output (Japanese Unexamined Patent Application Publication No. 10-74972).

In another alignment mechanism, the epitaxial layer side surface of a PD used as a light receiving element is coated with a reflection film (HR film: High Reflection) having a predetermined reflection to apply optical output of a LD to the reflection film of the PD so that part of light is transmitted and output as monitor light to optical fibers, and most of light is reflected light and output as optical output to optical fibers (Japanese Unexamined Patent Application Publication No. 8-116127).

However, in the alignment mechanism using the rear optical output for monitoring, it is necessary to control the temperature dependence of the front optical output/rear optical output ratio, but control of the temperature dependence is difficult. Namely, when all the relations given below can be controlled, an alignment mechanism can be realized, in which the reflectance on the surface of a PD is changed according to a wavelength shift on the basis of the relation between the LD temperature and the wavelength shift.

(1) The relation between the LD temperature and the front optical output/rear optical output ratio.

(2) The relation between the LD temperature and the wavelength shift (3) The relation between the wavelength and the reflectance of a reflection film (4) The relation between the structure of a reflection film and reflectance For example, in any case in which the wavelength of a LD is intentionally changed, the above relations cannot be controlled. Since it is necessary to strictly control all items including the film thickness of the reflection film, the production cost is increased. In brief, from a practical viewpoint, the complete control of the temperature dependence cannot be easily realized.

In addition, in the alignment mechanism in which part of light is transmitted and used for monitoring and most of light is reflected and used as output using the reflection film, a p-type portion electrode and wiring to an electrode pad are disposed near the center of the PD provided below the reflection film, and thus unevenness or a step shape of the wiring is reflected in the reflection film. Therefore, the reflectance and reflection direction of the reflection film are changed at a step portion, and thus output light is not output to the optical fiber side from this portion. As a result, even when light emitted from a LD has a normal intensity distribution (positional distribution of intensity), the intensity distribution of reflected light is greatly disturbed, thereby increasing noise and causing difficulty in using as an optical signal.

As a countermeasure for avoiding the disturbance in the intensity distribution of reflected light, a light receiving surface may be sufficiently widened for the spread of LD emitted light. However, this has the following problem: A p-type region is formed by Zn doping but has a limited doping amount and rate of electrical activation. And because of a relatively small thickness, when a current spreads in a transverse direction, the electric resistance is significantly increased. Thus, the driving voltage must be increased, and the frequency response characteristic is degraded due to the excessively high capacity. When the thickness of an epitaxial film of a p-type region is increased for decreasing the driving voltage, the cost of formation of the epitaxial film is increased. For example, when a fine mesh p-type electrode is provided for decreasing the electric resistance of a p-type region, a capacity due to the mesh electrode is excessively increased to degrade the frequency response characteristic. In addition, the fine unevenness of the mesh electrode inhibits normal reflection, thereby causing difficulty in using reflected light as an optical signal.

SUMMARY OF THE INVENTION

Accordingly, it is an object of the present invention to provide a semiconductor light emitting device capable of easily realizing stable output characteristics in a wide temperature range.

In accordance with an embodiment of the present invention, a semiconductor light emitting device includes a semiconductor laser element emitting a laser beam, and a semiconductor photodiode including a first conductivity type semiconductor layer disposed on a first surface of a first conductivity type semiconductor substrate, a first conductivity type absorption layer disposed on the first conductivity type semiconductor layer to receive the laser beam, a cap layer disposed on the absorption layer, a second conductivity type region formed in the cap layer and the absorption layer, a second electrode in ohmic contact with the second conductivity type region formed in the cap layer, a transmissive reflection unit disposed on a second surface opposite to the first surface, and a first electrode in ohmic contact with the semiconductor substrate. In an arrangement in which the semiconductor photodiode is mounted with the epitaxial layer side down, and the transmissive reflection unit is irradiated with the laser beam emitted from the semiconductor laser element, light reflected by the transmissive reflection unit is used as output light, and light transmitted through the transmissive reflection unit is received by the semiconductor photodiode and used for controlling the output of the semiconductor laser element. In this case, the first electrode can be provided in ohmic contact with either of the back side (second surface) and the first surface of the semiconductor substrate.

In accordance with another embodiment of the present invention, a semiconductor light emitting device includes a semiconductor laser element emitting a laser beam, and a semiconductor photodiode including a first conductivity type semiconductor layer disposed on a first surface of a first conductivity type semiconductor substrate, a first conductivity type absorption layer disposed on the first conductivity type semiconductor layer to receive the laser beam, a cap layer disposed on the absorption layer, a second conductivity type region formed in the cap layer and the absorption layer, a second electrode in ohmic contact with the second conductivity type region formed in the cap layer, a first electrode in ohmic contact with the first conductivity type semiconductor layer, and a transmissive reflection unit disposed on a second surface opposite to the first surface. In an arrangement in which the semiconductor photodiode is mounted with the epitaxial layer side down, and the transmissive reflection unit is irradiated with the laser beam emitted from the semiconductor laser element, light reflected by the transmissive reflection unit is used as output light, and light transmitted through the transmissive reflection unit is received by the semiconductor photodiode and used for controlling the output of the semiconductor laser element. In this case, the first electrode is formed in ohmic contact with a region in which the absorption layer is not formed on the first conductivity type semiconductor layer. The absorption layer is formed on the first conductivity type semiconductor layer avoiding a region for forming the first electrode.

In the above-mentioned two types of semiconductor light emitting devices of the present invention, the transmissive reflection unit means a unit which reflects almost light, not 100%, and transmits remaining light, and includes a HR film, any one of various gratings, a polarization splitter, a uniform micro hole distributed reflective film, or the like.

In the above-mentioned two types of semiconductor light emitting devices of the present invention, a laser beam emitted from one of the end faces of LD is mostly reflected by the transmissive reflection unit formed on the flat back surface of the semiconductor substrate of the PD and output to optical fibers, and the transmitted remaining light is received by the PD and converted to an electric signal, i.e., a monitor current. A transmissive reflection unit of a type which is difficult to dispose because of the unevenness of a substrate surface can be used in the above-described constitution. As a result, reflected light is not disturbed by the unevenness of the substrate surface on which the transmissive reflection unit is disposed. Further, by using a transmissive reflection unit which is conventionally difficult to use, light with an intensity distribution substantially similar to the intensity distribution (distribution on an irradiated surface) of the semiconductor laser element or a smooth intensity distribution which is not similar thereto but has no disturbance in a beam section can be output to optical fibers. It is also possible to avoid deterioration in control accuracy due to a change in the front optical output/rear optical output characteristic with the LD temperature. As a result, it is possible to provide a semiconductor light emitting device capable of controlling optical output with high accuracy without the influence of a temperature change and outputting light having an intensity distribution without disturbance and noise.

In accordance with a further embodiment of the invention, the semiconductor photodiode of each of the above-described semiconductor light emitting devices is flip-chip mounted. In this case, in order to permitting flip-chip mounting, the semiconductor photodiode is a horizontal type photodiode. In this constitution, an electrode is disposed on the epitaxial layer side surface, not on the back surface of the semiconductor substrate, and thus the entire back surface of the semiconductor substrate is a flat surface, thereby permitting the entire flat back surface of the semiconductor substrate to be used as a substrate surface for the transmissive reflection unit. Therefore, it is possible to relax the positioning accuracy of the transmissive reflection unit on the PD and the positioning accuracy of the PD and the LD.

As the transmissive reflection unit, a transmissive reflection film having a reflectance of 50% to 90% for light at a wavelength of 1000 nm to 1700 nm can be used. In this case, when a transmissive reflection film with excellent usability, for example, a HR film, is used, it is possible to realize a light emitting device for communication in a wavelength range of 1000 nm to 1700 nm, which has the above-described advantages.

Furthermore, an InP substrate can be used as the semiconductor substrate, and an InGaAs layer or InGaAsP can be used as the absorption layer. In this case, a light emitting device for communication in a wavelength range of 1000 nm to 1700 nm can be realized, in which output control with high stability for a temperature change can be realized, and a driving voltage is not increased.

The transmissive reflection unit can be formed using a multilayer film including a silicon film and a silicon oxide film or an alumina multilayer film. In this case, the required reflectance can be securely obtained using a proven existing material supply system. Furthermore, the transmissive reflection film can be formed using a dielectric multilayer film. In this case, the reflectance can be easily controlled according to wavelength.

The first electrode and an electrode pad thereof can be provided in a region not irradiated with the laser beam. Since the first electrode is provided on the back surface (second surface) of the semiconductor substrate, the semiconductor photodiode of the semiconductor light emitting device is a vertical type photodiode. In this case, the substrate surface of the transmissive reflection unit can be securely flattened in a region irradiated with the laser beam. As a result, reflected light (output light) with no disturbance and high uniformity can be obtained. Such positioning of the electrode at en end of the semiconductor substrate is particularly preferred when the semiconductor substrate is an n-type. Further, the concentration of an n-type impurity to be introduced to make the semiconductor substrate n-type can be easily increased as compared with a p-type impurity. Therefore, even when an electrode is disposed at an end, current spreading resistance can be suppressed to a low level, and the driving voltage need not be increased. Thus, the power consumption can be suppressed.

The first electrode and an electrode pad thereof can be provided at each of the four corners of the second surface (back side) of the semiconductor substrate. In this case, a high concentration of impurity can be introduced into the n-type (first conductivity type) semiconductor substrate, thereby decreasing the current spreading resistance of the semiconductor substrate and thus preventing an increase in the driving voltage. The semiconductor photodiode is also a vertical type photodiode.

The first electrode can be provided in a ring form, and an electrode pad can be provided at any position of the ring electrode. In this case, an increase in the current spreading resistance of the semiconductor substrate can be prevented, and wire bonding may be provided at only one position, thereby decreasing the manufacturing cost. The semiconductor photodiode is also a vertical type photodiode.

The first electrode may be formed in a layer using a material having a transmittance of 60% or more for light at a wavelength of 1000 nm to 1700 nm, and the transmissive reflection unit may be provided on the layer electrode. In this case, an increase in current spreading resistance can be prevented. In addition, the electrode can be formed in a region irradiated with the laser beam, and thus the electrode area can be increased, thereby suppressing an increase in driving voltage due to an increase in electrode contact resistance.

In the semiconductor photodiode, the thickness of the semiconductor substrate may be 100 μm to 400 μm, the n-type carrier concentration in the semiconductor substrate may be 1E18/cm$^3$ to 1E19/cm$^3$, and the long diameter of a region irradiated with the laser beam may be 50 μm to 500 μm. The long diameter represents the maximum span diameter of a laser beam spot. In this case, the size and shape of the laser beam are not limited, and optical output can be uniformly transmitted as reflected light to the optical fiber side. Within the above-described size range, the current spreading resistance is not increased due to a high concentration of impurity in the semiconductor substrate, and thus an increase in the driving voltage can be prevented.

The angle formed by the emission direction of the laser beam of the semiconductor laser and the transmissive reflection unit of the semiconductor photodiode may be 30° to 75°. As the angle decreases, the sectional shape of the laser beam applied to the photodiode or emitted to the optical fiber side generally becomes an elliptical shape with higher flatness. In fact, a lens is provided between an optical fiber and the photodiode to narrow the laser beam and then emit it to the optical fiber side. However, when the angle is 30° or less, the flatness, is excessively large to cause many errors. In addition, when the angle is over 75°, the laser element and the optical fiber cannot be disposed unless the distance from the photodiode is excessively increased. If the laser element and the optical fiber can be disposed, the entire size of the device is excessively increased. This is impractical from the viewpoint of an operating environment.

The semiconductor photodiode of the present invention includes the first conductivity type semiconductor layer formed on the first surface of the first conductivity type semiconductor substrate, the first conductivity type absorption layer positioned on the first conductivity type semiconductor layer to receive the laser beam, the cap layer positioned on the absorption layer, the second conductivity type region formed in the cap layer and the absorption layer, the second electrode in ohmic contact with the second conductivity type region in the cap layer, the transmissive reflection unit positioned on the second surface opposite to the first surface, and the first electrode in ohmic contact with the semiconductor substrate. In this case, the photodiode is mounted with the epitaxial layer side down, and the advantages of the semiconductor light emitting device of the present invention can be exhibited.

In accordance with a further embodiment of the present invention, a semiconductor photodiode includes a first conductivity type semiconductor layer disposed on a first surface of a first conductivity type semiconductor substrate, a first conductivity type absorption layer disposed on the first conductivity type semiconductor layer to receive the laser beam, a cap layer disposed on the absorption layer, a second conductivity type region formed in the cap layer and the absorption layer, a second electrode in ohmic contact with the second conductivity type region formed in the cap layer, a first electrode in ohmic contact with the first conductivity type semiconductor layer, and a transmissive reflection unit disposed on a second surface opposite to the first surface. In this case, in addition to the advantage of the semiconductor photodiode to be mounted with the epitaxial layer side down, the first electrode (n-type portion electrode) is not disposed on the back side because of flip-chip mounting, and thus the wide flat back surface (second surface) can be used.

DESCRIPTION OF THE PREFERRED EMBODIMENTS

First Embodiment

Figure 1:
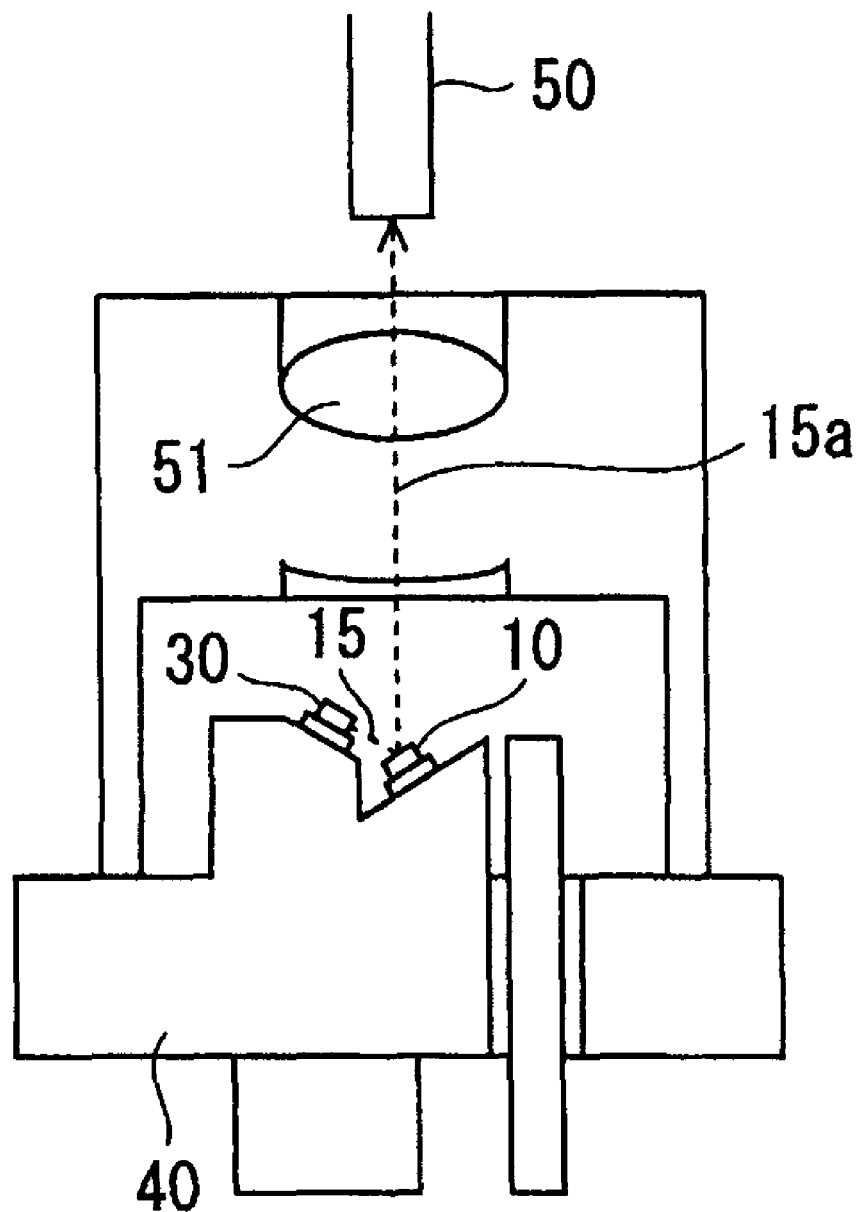
FIG. 1 is a view showing a semiconductor light emitting device according to a first embodiment of the present invention.
Figure 2:
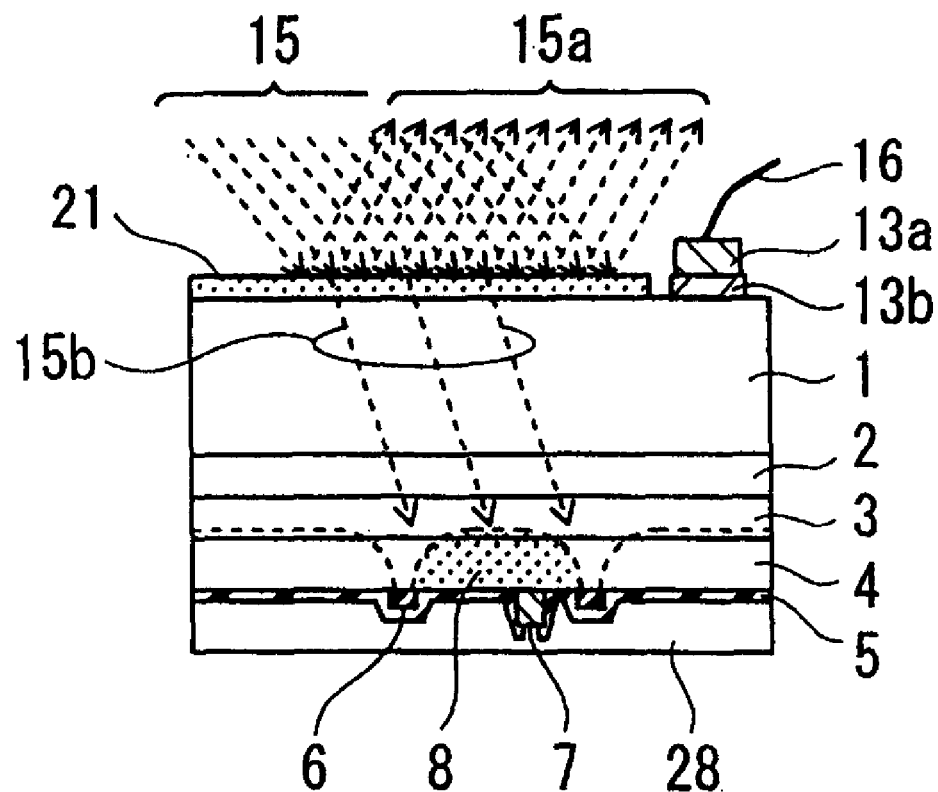
FIG. 2 is a sectional view of PD shown in FIG. 1.
Figure 3:
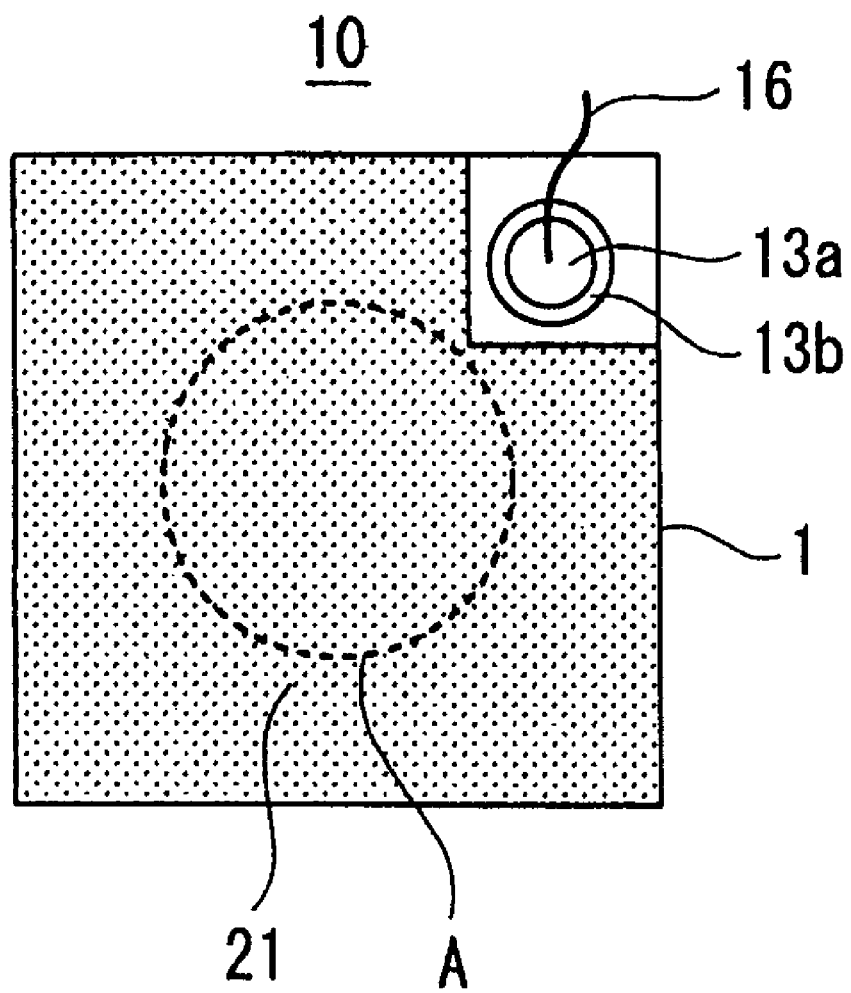
FIG. 3 is a plan view of PD shown in FIG. 1.

FIGS. 1 to 3 are views showing a semiconductor light emitting device according to a first embodiment of the present invention. Although not shown in FIG. 1, each of a laser diode (LD) and a photodiode (PD) is connected to a plurality of lead terminals through wiring in order to maintain electrical connection with the outside. A LD 30 and a PD 10 are mounted on a stem 40. When a LD driving current is passed through the LD 30 from the outside, a laser beam 15 is emitted from one of the ends of the LD 30 and applied to a reflection surface of the PD 10 at a predetermined angle. Most of the applied laser beam 15 is reflected by a transmissive reflection film of the PD 10, passes as output light 15*a* through a lens 51, and is output to an optical fiber 50. The light transmitted through the transmissive reflection film without being reflected is received by an absorption layer in the PD 10, converted to an electric signal, and output as a monitor current to the outside. The LD driving current is controlled according to the monitor current to control LD output and control optical output to be introduced into the optical fiber. A reflection film (not shown in the drawing) is disposed on the other end face of the LD 30 so that substantially 100% of light can be reflected. The wavelength of light emitted from the LD 30 is 1200 nm.

As shown in FIG. 2, the PD 10 includes an n-type InP buffer layer 2, an InGaAs absorption layer 3, and an InP cap layer 4 which are epitaxially grown in that order on an InP-type P substrate 1. The InGaAs layer 3 and the InP cap layer 4 in a light receiving portion constitute a p-type region 8. Further, a p-type electrode 7 is disposed in a p-type region of the InP cap layer 4, and the InP cap layer 4 is coated with a passivation film 5. In addition, a diffusion mask pattern 6 used for forming the p-type region 8 is interposed between the passivation film 5 and the InP cap layer 4.

The PD 10 is characterized by being mounted with the epitaxial layer side down. Namely, the PD 10 is mounted on the stem with wiring and a conductive adhesive layer 28 disposed below the passivation film 5 and a p-type electrode 7. Furthermore, a transmissive reflection film 21 is disposed on the back side of the n-type InP substrate 1 so that it is irradiated with the laser beam 15 emitted from the LD 30. Most of the laser beam 15 is reflected as output light 15a, and part of the laser beam 15 is absorbed as transmitted light 15b and converted to a current (monitor current) at a PN junction of the absorption layer 3. In addition, an n-type portion electrode 13b, an electrode pad 13a thereof, and a wire 16 are disposed on the back side of the n-type substrate 1 within a region not irradiated with the laser beam 15. In this structure, the transmissive reflection film 21 to be irradiated with the laser beam 15 is disposed only on a flat portion without steps on the substrate surface. Therefore, output light includes the reflected light 15a reflected only from the transmissive reflection film 21 disposed on the flat surface, thereby emitting output light without disturbance which is suitable for optical communication.

The angle formed by the emission direction of the laser beam 15a and the transmissive reflection film 21 of the semiconductor photodiode is preferably 30° to 75°. As the angle decreases, the sectional shape of the laser beam emitted to the optical fiber side generally becomes an elliptical shape with higher flatness. In fact, a lens is provided between the optical fiber and the photodiode to narrow the laser beam and then emit it to the optical fiber side. However, when the angle is 30° or less, the flatness is excessively large to cause many errors. On the other hand, when the angle is more than 75°, the laser element and the optical fiber cannot be disposed unless the distance from the photodiode is excessively increased. In addition, if the laser element and the optical fiber can be disposed, the entire size of the device is excessively increased. This is impractical from the viewpoint of an operating environment.

As described above, the n-type portion electrode 13b can be disposed at an end of the n-type InP substrate 1 because the concentration of n-type impurity in the n-type InP substrate 1 can be easily increased to a relatively high value, and the n-type InP substrate 1 has low electric resistance. Because of the low resistance of the n-type InP substrate 1, even when the n-type portion electrode 13b is disposed at an end of the InP substrate 1, current spreading resistance can be suppressed, and thus the driving voltage need not be increased.

Next, a method for manufacturing the semiconductor light emitting element will be described. The InP substrate 1 with a thickness of, for example, 400 μm, which is made n-type by doping with S at $5E18/cm^3$, is used as a semiconductor substrate. Then, the InP buffer layer 2 made n-type by Si doping at $2E17/cm^3$, the InGaAs absorption layer 3 at an n-type impurity concentration decreased to about $1E15/cm^3$, and the nondoped InP cap layer 4 are provided in order on the InP substrate 1. Next, Zn is introduced, from the outside, into the InP cap layer 4 and the InGaAs absorption layer 3 within a predetermined region using the passivation mask pattern 6 formed on the InP cap layer 4. Then, Zn is diffused to form the p-type region 8 in a light receiving portion. The carrier concentration in the p-type region 8 of the InP cap layer 4 is, for example, $3E18/cm^3$.

Then, the p-type portion electrode 7 is provided in contact with the p-type region 8, and a portion excluding the p-type portion electrode 7 is coated with the protective film (passivation film) 5. Then, the semiconductor substrate 1 is decreased in thickness so that the thickness of the PD is, for example, 200 μm. Next, the n-type portion electrode 13b composed of AuGeNi is provided, and the electrode pad 13a of Au is provided thereon. Then, the electrode pad 13a is electrically connected to the outside through the bonding wire 16. As shown in FIGS. 2 and 3, the n-type portion electrode 13b and the electrode pad 13a provided thereon are disposed in a portion which is not irradiated with the laser beam 15a. Next, the transmissive reflection film 21 is provided on a region of the back side of the semiconductor substrate in which the n-type portion electrode is not provided. The transmissive reflection film 21 includes, for example, a multilayer film of Si and $SiO_2$ with a reflection of 70% for light at a wavelength of, for example, 1310 nm. Next, the PD is mounted on the stem using a conductive adhesive 28 so as to cause conduction between the p-type electrode 7 and the stem. The p-type portion electrode 7 is electrically connected, through the bonding wire, to the outside with adhesive and the stem provided therebetween.

As shown in FIG. 3, the n-type portion electrode can be provided in a portion sufficiently apart from an irradiation region A of the laser beam 15, and thus, in a portion irradiated with the laser beam, the transmissive reflection film 21 is formed on a flat substrate surface. As a result, reflected light from the transmissive reflection film has a normal intensity distribution, and thus light suitable for optical communication can be output.

As described above, even when the n-type portion electrode is disposed at an end of the semiconductor substrate, the current spreading resistance is not increased because the concentration of n-type impurity in InP can be easily increased to decrease the specific resistance. As a result, as described above, it is allowable to provide the n-type portion electrode at an end of the n-type InP substrate and to form the transmissive reflection film on a flat portion.

Second Embodiment

Figure 4:
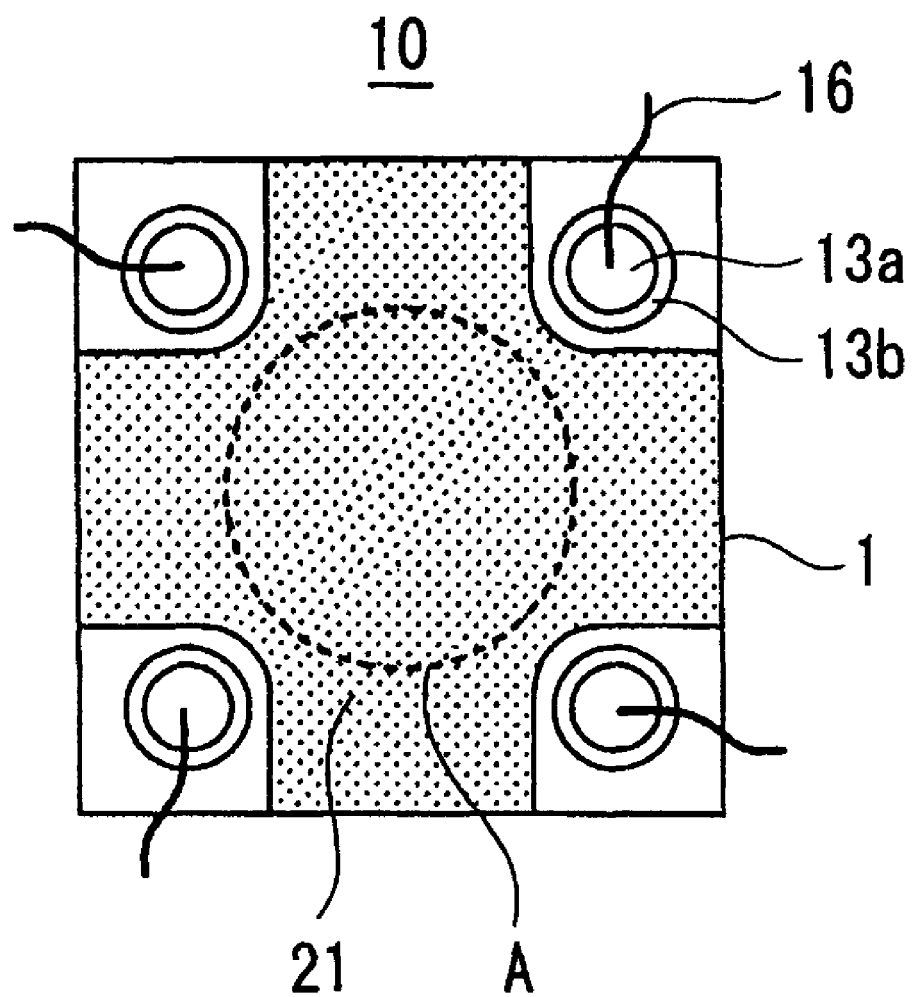
FIG. 4 is a plan view of PD of a semiconductor light emitting device according to a second embodiment of the present invention.

FIG. 4 is a drawing showing a photodiode PD 10 of a light emitting device according to a second embodiment of the present invention. The PD 10 is characterized in that an n-type portion electrode 13b and an electrode pad 13a for wire bonding are provided at each of the four corners of the back side of a semiconductor substrate 1 of the PD 10, for making conduction between each electrode pad 13a and the outside through a bonding wire 16. Each reference numeral in the drawing denotes the same as in FIGS. 2 and 3. The transmissive reflection film 21 can be disposed only in a flat region where the n-type portion electrode 13b and the electrode pad 13a thereof are not provided. As a result, optical output with a normal intensity distribution can be output to optical fibers.

In addition, a high concentration of n-type impurity can be introduced into semiconductor InP, thereby easily decreasing the electric resistance. Therefore, as described above, even when the n-type portion electrode 13b is provided at each of the four corners of the back side of the n-type InP substrate 1 to excessively decrease the thickness of the semiconductor substrate of the PD or excessively increase a laser beam irradiation portion A of the PD, the current spreading resistance does not occur in the n-type portion because of the low electric resistance, and thus optical output can be easily controlled without an increase in the driving voltage. By providing the n-type portion electrode 13b at each of the four corners, the current spreading resistance can be more suppressed as compared with the case in which the n-type portion electrode 13b is provided at one corner.

Third Embodiment

Figure 5:
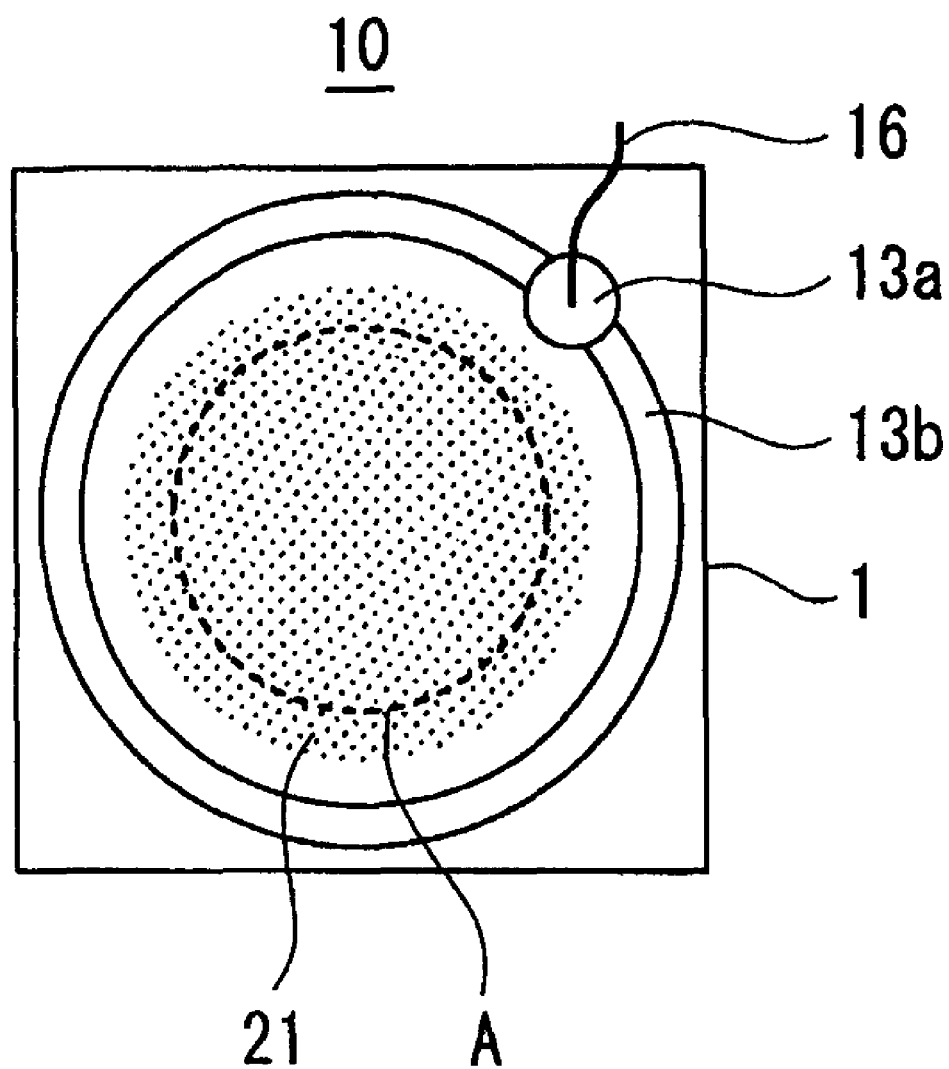
FIG. 5 is a plan view of PD of a semiconductor light emitting device according to a third embodiment of the present invention.

FIG. 5 is a drawing showing a photodiode PD 10 of a light emitting device according to a third embodiment of the present invention. This embodiment is characterized in that an n-type portion electrode 13b is provided in a ring form to surround a laser irradiation region A. Each reference numeral in the drawing denotes the same as in FIGS. 2 and 3. In this structure, in addition to the same effect as that of the PD of the second embodiment (FIG. 4), only one electrode pad 13a may be provided for wire bonding, thereby decreasing the cost of wire bonding. Although FIG. 5 shows a ring shape as an example, the shape of the n-type portion electrode 13b may a rectangular shape or a shape broken at a position of its periphery.

Fourth Embodiment

Figure 6:
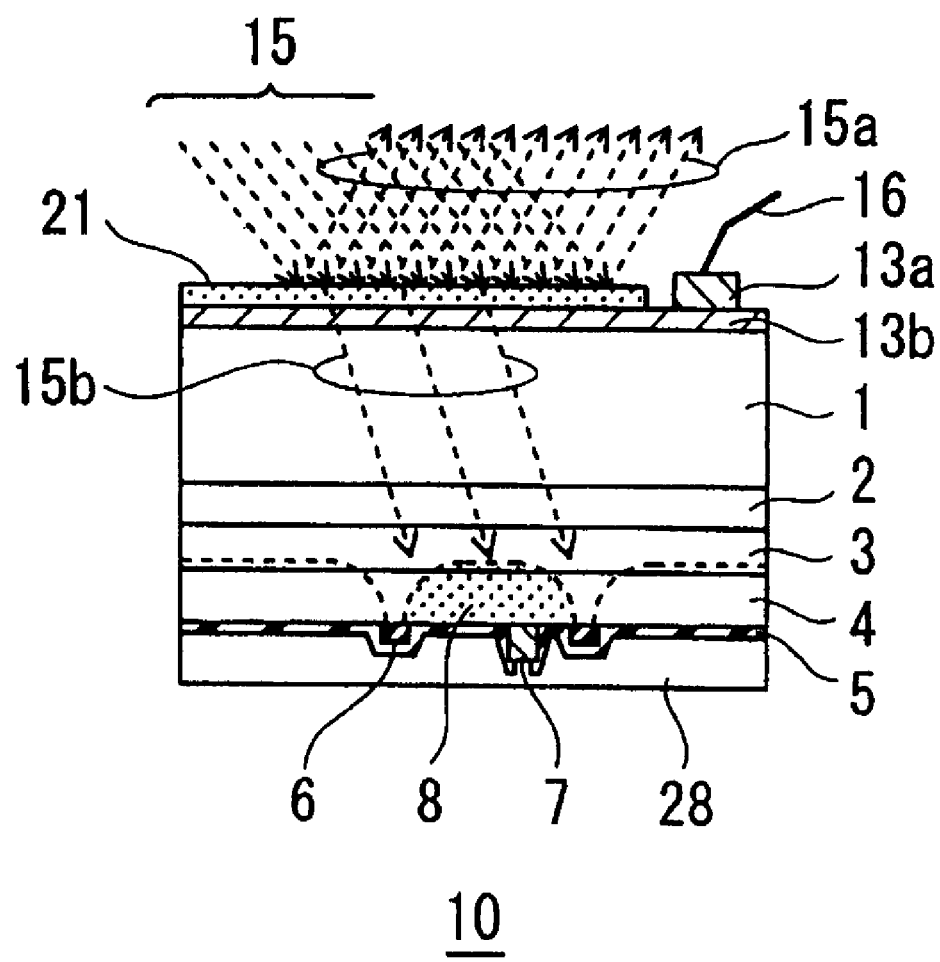
FIG. 6 is a sectional view of PD of a semiconductor light emitting device according to a fourth embodiment of the present invention.
Figure 7:
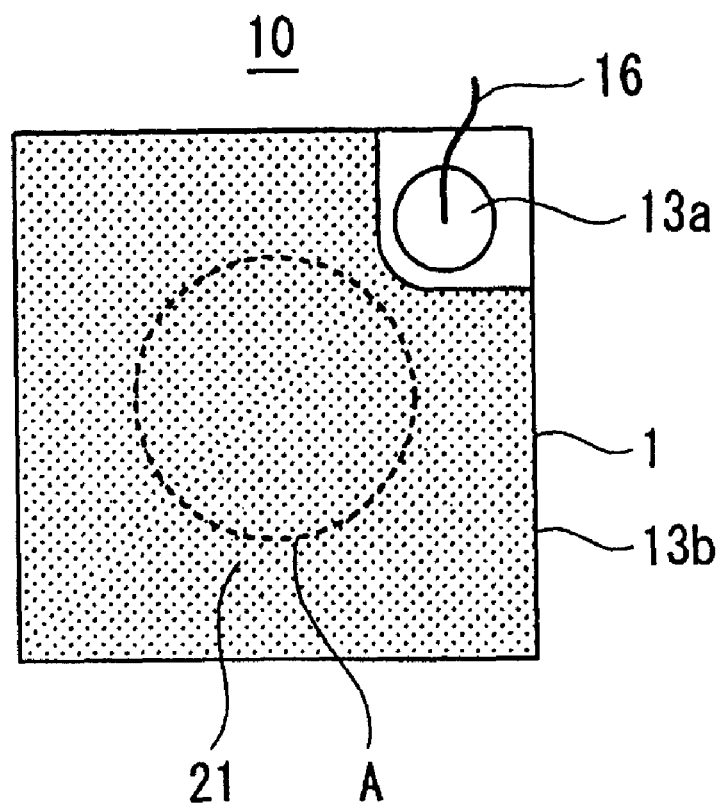
FIG. 7 is a plan view of PD shown in FIG. 6.

FIGS. 6 and 7 are drawings showing a photodiode PD 10 of a light emitting device according to a fourth embodiment of the present invention. This embodiment is characterized in that an n-type portion electrode 13b is formed in a layer using a material transmitting a laser beam so as to cover the back side of an InP substrate 1, a transmissive reflection film 21 being disposed o the n-type portion electrode 13b. Each reference numeral in the drawing denotes the same as in FIGS. 2 and 3. In this structure, the n-type portion electrode 13b is provided in a wide range of the back side of the semiconductor substrate 1, and optical output can be precisely controlled like in the light emitting devices of the first to third embodiments.

Therefore, the contact resistance of the n-type portion electrode 13b can be further decreased as compared with the PD 10 of the light emitting device of each of the first to third embodiments. In addition, current spreading resistance can be suppressed in an n-type portion (n-type semiconductor/n-type buffer layer/n-type absorption layer). Such a transparent n-type portion electrode for light in a wavelength range for optical communication can be formed using ZnO or ITO (Indium Tin Oxide).

Fifth Embodiment

Figure 8:
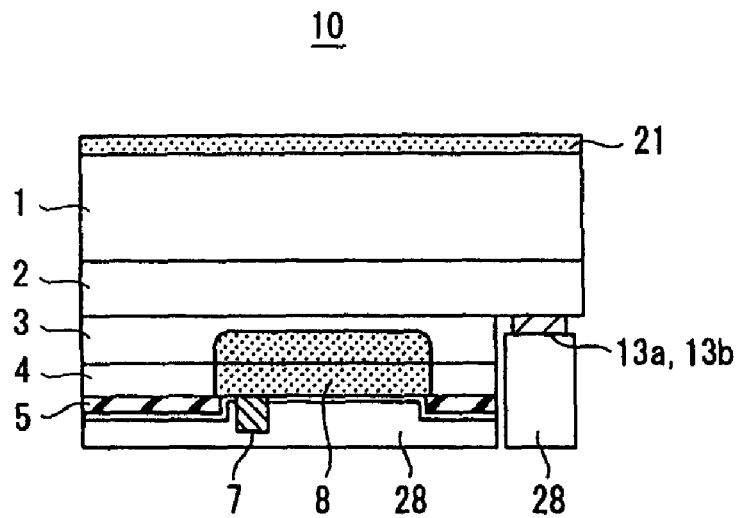
FIG. 8 is a sectional view of PD of a semiconductor light emitting device according to a fifth embodiment of the present invention.
Figure 9:
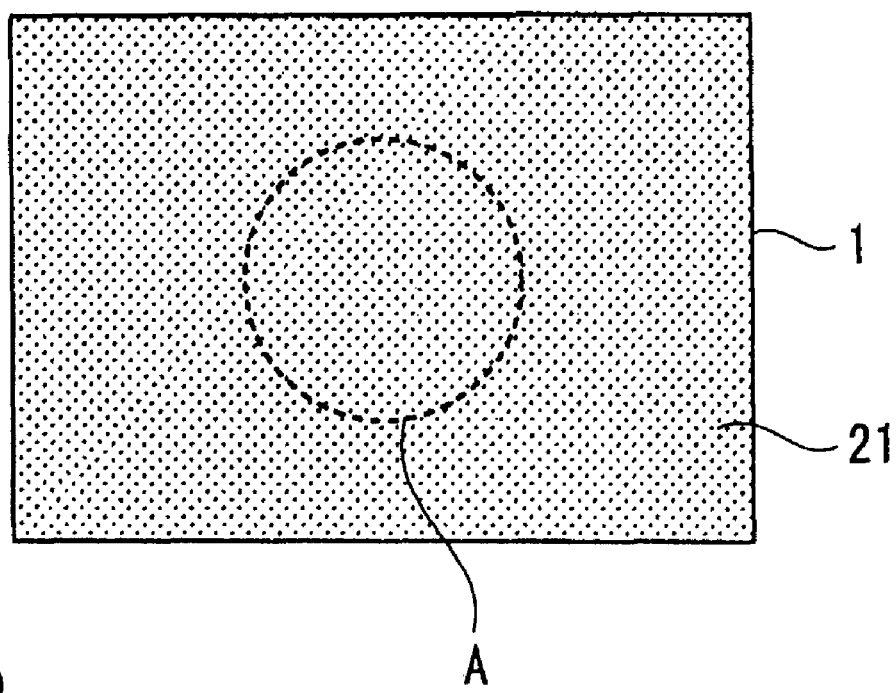
FIG. 9 is a plan view of PD shown in FIG. 8.

FIGS. 8 and 9 are drawings showing a photodiode PD 10 of a light emitting device according to a fifth embodiment of the present invention. This embodiment is characterized in that the photodiode PD 10 is a horizontal type photodiode in which carriers move along the surface of a semiconductor substrate, the horizontal type photodiode being mounted with an epitaxial layer side down, i.e., flip-chip mounted. The PD of each of the first to fourth embodiments is a vertical type photodiode in which carrier move in the thickness direction of a semiconductor substrate. Each reference numeral in the drawings denotes the same as in FIGS. 2 and 3. As described above, the horizontal type element is mounted with an epitaxial layer side down (flip-chip mounted), and thus both the n-type portion electrode 13b and the p-type portion electrode 7 are not provided on the back side of the InP substrate 1. In addition, the electrode pad and the bonding wire are not disposed on the back side of the InP substrate 1.

In this structure, the transmissive reflection film 21 is disposed over the entire surface of the back side of the InP substrate 1. Since no step is formed in the substrate surface, the positioning accuracy of the transmissive reflection film on the PD and the positioning accuracy of the PD and LD can be relaxed, thereby permitting the easy manufacture of the light emitting device.

Figure 10:
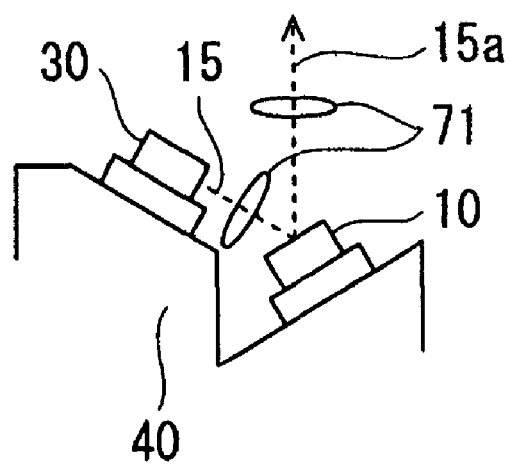
FIG. 10 is a view showing outlines of a test method for a semiconductor light emitting device in an example.

Next, the results of a test for measuring an intensity distribution (position accuracy) of output light (light reflected from the PD) of the semiconductor light emitting device of the present invention will be described. FIG. 10 shows outlines of the test. A light intensity distribution was measured by a light intensity distribution (position distribution) detector 71 for the laser beam 15 emitted from the LD 30 and the output light 15a reflected from the PD 10. As the PD 10 used as a component of the semiconductor light emitting device, the PD of the first embodiment of the present invention was used (example of the invention). For comparison, a conventional PD was formed and subjected to the test (comparative example). The example of the invention and the comparative example differ in PD and a portion due to PD, and the other portions are the same in both examples.

EXAMPLE OF THE INVENTION

Figure 11:
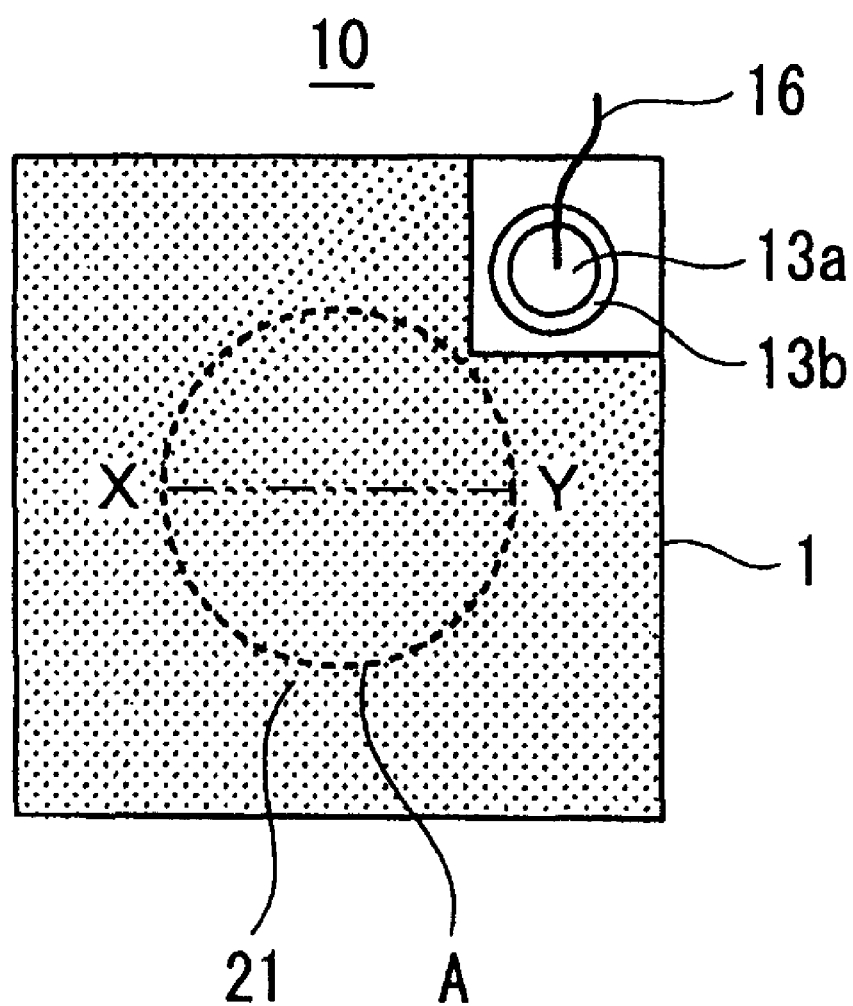
FIG. 11 is a plan view of PD of a semiconductor light emitting device in an example the present invention.

The PD of the semiconductor light emitting device of the example of the invention had the structure (first embodiment) shown in FIGS. 2 and 3. The PD was produced according to the method described in the first embodiment. The size of a PD chip mounted on the stem was 400 square μm, and the diameter of the n-type portion electrode on the back side of the semiconductor substrate, i.e., on the laser beam irradiation side, was 100 μm. On the other hand, the region A of the LD laser beam applied to the PD was a circle having a diameter of about 200 μm (refer to FIG. 11). Therefore, an n-type portion electrode can be provided on a portion sufficiently apart from the laser beam irradiation range. The transmissive reflection film was formed on the flat substrate surface in a portion irradiated with the laser beam.

The transmissive reflection film covering the back side of the PD had a reflectance of about 70%. Therefore, about 70% of the laser beam is reflected to optical fibers, and the remaining about 30% is absorbed in the PD and converted to an electric signal to produce a monitor current.

Comparative Example

Figure 12:
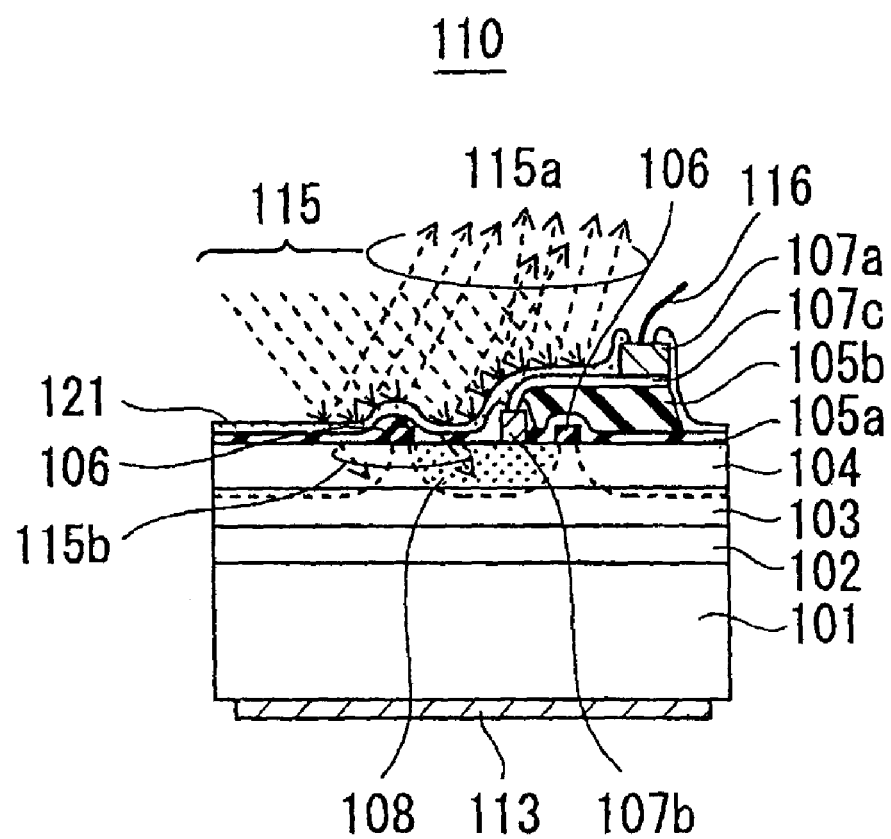
FIG. 12 is a sectional view of PD of a semiconductor light emitting device in a comparative example.
Figure 13:
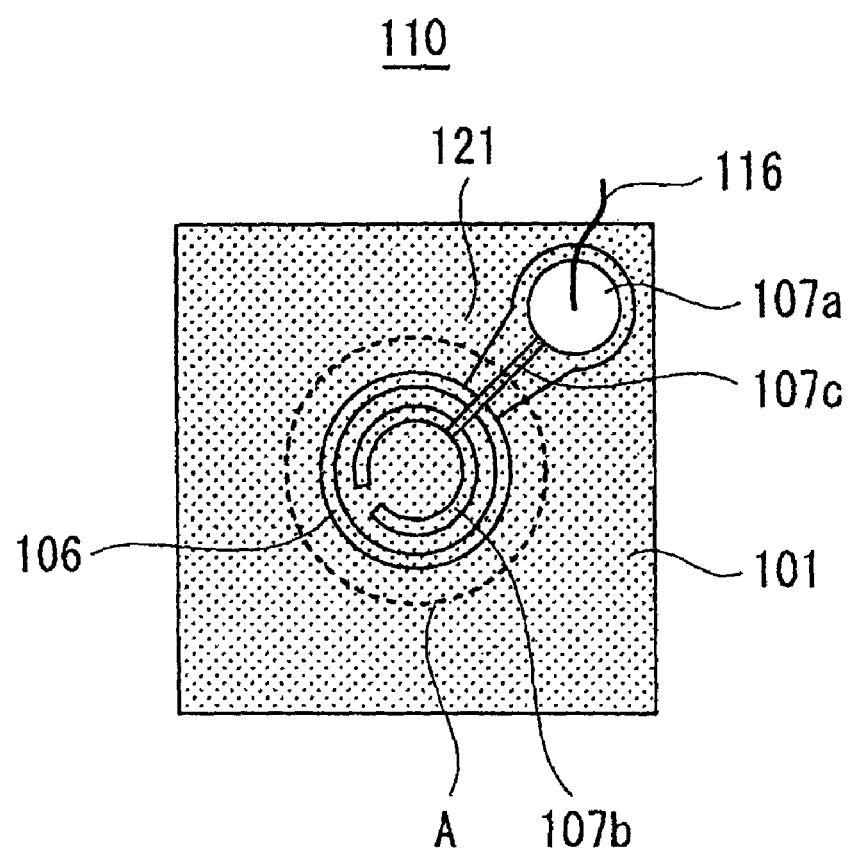
FIG. 13 is a plan view of PD shown in FIG. 12.

FIGS. 12 and 13 show the structure of a PD of a semiconductor light emitting device of the comparative example. The structure of PD 110 of the semiconductor light emitting device of the comparative example will be described with reference to the manufacture method thereof. First, an InP substrate 101 with a thickness of 400 μm and made n-type by S doping at 5E18/cm$^3$ was prepared. Then, an InP buffer layer 102 made n-type by Si doping at 2E17/cm$^3$, an InGaAs absorption layer 103 with an impurity concentration decreased to 1E15/cm$^3$, and a non-doped InP cap layer 104 were provided in order on the InP substrate 101. Then, Zn was diffused from the outside in a predetermined range of the InP cap layer 104 and the InGaAs absorption layer 103 using a diffusion mask pattern 106 formed on the InP cap layer 104 to form a p-type region 108 in a light receiving portion. The carrier concentration in the p-type region of the InP cap layer 104 was 3E18/cm$^3$.

Then, a p-type portion electrode 107*b* was provided at a predetermined position, and a protective film 105*a* was formed to cover a portion excluding the p-type portion electrode 107*b*. Next, a wiring electrode 107*c* extending from the p-type portion electrode 107*b* to an electrode pad 107*a* and the electrode pad 107*a* were provided. Next, the electrode pad 107*a* was electrically connected to the outside through a bonding wire 116. Then, a transmissive reflection film 121 was provided on a portion excluding the electrode pad 107*a*. The transmissive reflection film 121 was formed in a multilayer film of Si and $SiO_2$ and had a reflectance of 70% for light at a wavelength of 1300 nm. The thickness of the InP substrate 101 was decreased so that the thickness of the PD 110 was 200 μm. Then, an n-type portion electrode 113 composed of AuGeNi was provided on the back side of the InP substrate 101.

The PD 110 produced by the above-described method was mounted on a stem with the reflection film side (epitaxial layer side) up using a conductive adhesive (substrate down mounting). The n-type portion electrode 113 was electrically connected through the bonding wire to the outside with the adhesive and the stem provided therebetween.

Figure 14:
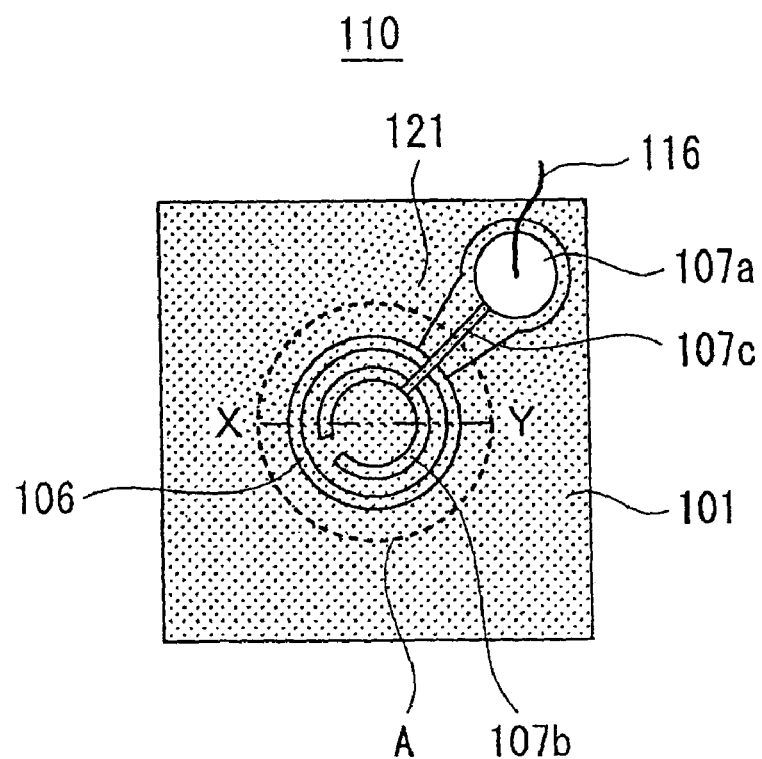
FIG. 14 is a plan view of PD of a semiconductor light emitting device in a comparative example.

The PD chip mounted as described above was 400 square μm in size, and the diffusion mask pattern on the epitaxial layer side, i.e., the laser beam irradiation side, had an open hole circle with a diameter of 150 μm. Further, the p-type portion electrode 107*b* was 100 μm in diameter, and a region A of a LD laser beam applied to the PD was a circular region with a diameter of 200 μm (refer to FIG. 14). Therefore, a laser beam 115 was applied to the transmissive reflection film 121 formed on the substrate surface having unevenness formed by the p-type portion electrode 107*b* and the open circle of the diffusion mask pattern 106.

Test Results

Figure 15:
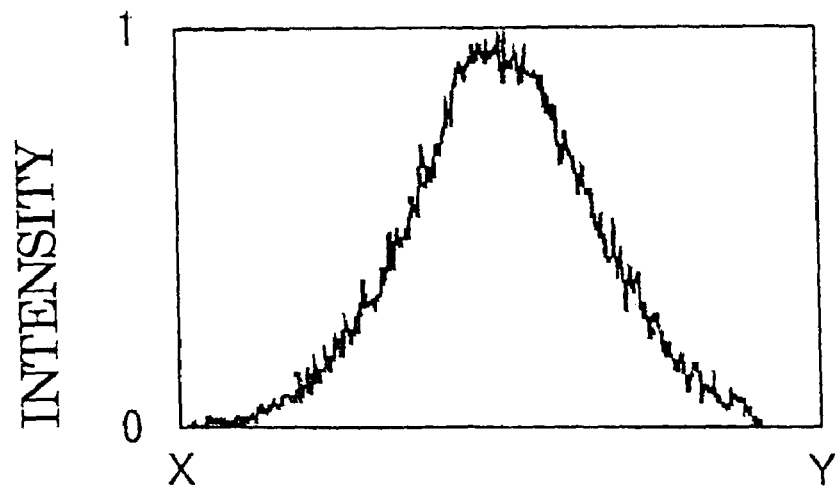
FIG. 15 is a diagram showing an intensity distribution of LD emitted light in an example of the present invention.
Figure 16:
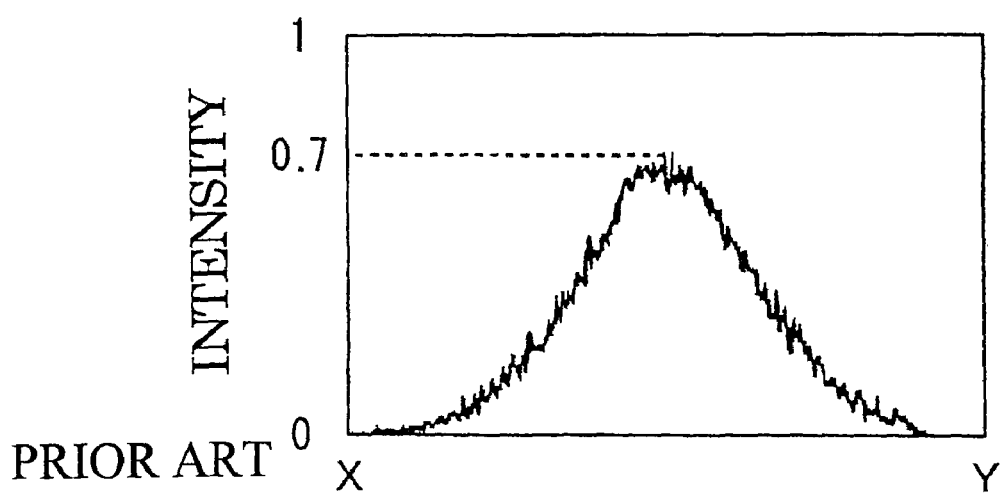
FIG. 16 is a diagram showing an intensity distribution of PD reflected light in an example of the present invention.
Figure 17:
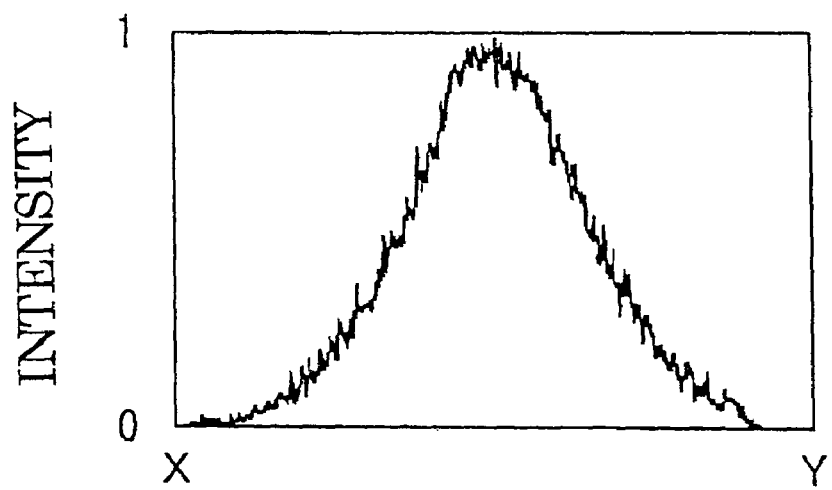
FIG. 17 is a diagram showing an intensity distribution of LD emitted light in a comparative example.
Figure 18:
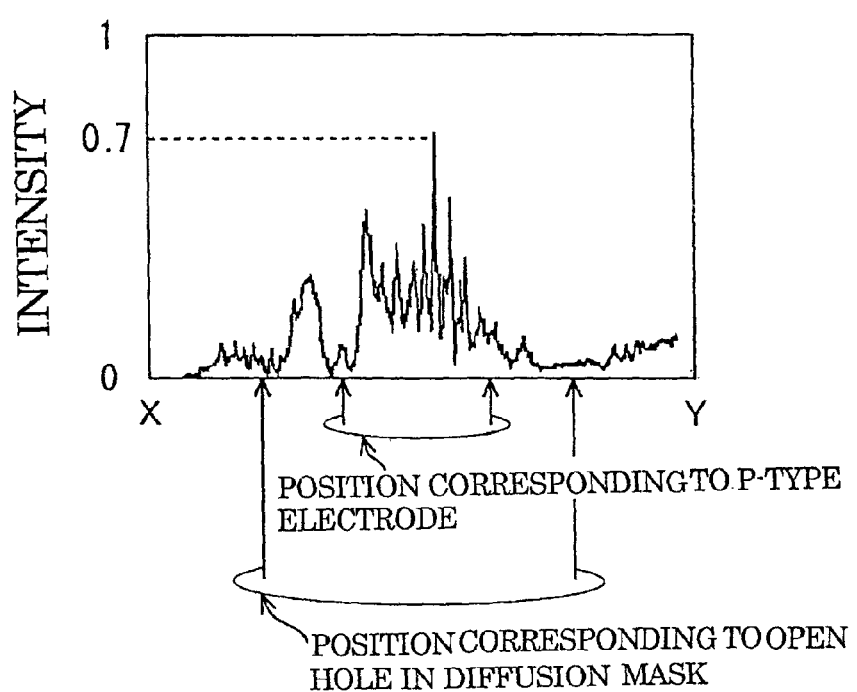
FIG. 18 is a diagram showing an intensity distribution of PD reflected light in a comparative example.

With respect to the light emitting device manufactured as described above, the intensity distribution of the laser beam emitted from the LD and the intensity distribution of light reflected to the optical fiber side from the PD were measured. FIGS. 15 and 16 show the results of measurement in the example of the present invention, and FIGS. 17 and 18 show the results of measurement in the comparative example. As shown in FIGS. 15 and 17, the intensity distribution of light emitted from the LD is substantially the same. However, in the comparative example, as shown in FIG. 18, the distribution of light reflected to the optical fibers is greatly disturbed and has large noise, as compared with the intensity distribution of irradiation light. In the intensity distribution of reflected light, an irregular portion corresponds to a position where the edge of the open hole circle of the diffusion mask pattern and the p-type portion electrode are positioned to cause unevenness in the transmissive reflection film. In the transmissive reflection film, the reflection surface is locally inclined at an uneven position, or the structure of a multilayer film serving as the transmissive reflection film is locally disturbed, and thus light is disturbed, not uniformly output to the optical fiber side. In addition, when the semiconductor light emitting device of the comparative example was applied to optical communication, an optical output distribution and noise were unstable, thereby greatly deteriorating the accuracy of optical output control.

On the other hand, in the example of the invention, as shown in FIG. 16, light with an intensity distribution similar to that of light emitted from the LD is reflected to the optical fibers. This is due to the fact that as in an image of an optical path shown by broken lines in FIG. 2, the reflection surface is substantially flat, and thus the multilayer structure of the reflection film is not disturbed. When the semiconductor light emitting device of the example of the invention was applied to optical communication, the device could be used as a light emitting device for optical communication without a problem.

Even in the structure of the semiconductor light emitting device of the comparative example, reflected light with relatively small disturbance can be obtained by increasing the size of the p-type portion electrode and the photodiode according to the laser irradiation range. However, in this case, the distance between the p-type portion electrode to a light receiving portion surrounded by the p-type portion electrode is increased, thereby increasing the electric resistance therebetween. Therefore, in some cases, the driving voltage should be excessively increased. Furthermore, the area of the p-type portion electrode and the distance from wiring to the electrode pad are increased, thereby increasing the element capacity and causing a significant influence on the frequency response characteristic. In the semiconductor light emitting device of the example of the invention, stable optical output with no noise can be obtained while avoiding the above problems.

Although the embodiments and example of the present invention have been described above, the semiconductor light emitting device of the present invention will be comprehensively described below. Namely, the semiconductor light emitting device of the present invention includes LD and PD, and the PD may have any structure in which it is mounted with the epitaxial layer side down, and light emitted from the LD is applied to a transmissive reflection unit positioned on the back side of a semiconductor substrate of the PD. The transmissive reflection unit is not limited to a HR film, and any one of various gratings, a polarization splitter, and a uniform micro hole distributed reflective film may be used as long as part of light emitted from the LD is transmitted, and remaining light is reflected. In this case, in a grating, the concept of reflection is not strict. For example, an incident angle and a reflection angle need not be the same, and like diffracted light, light may be reflected at a reflection angle different from an incident angle. In this sense, the expression "reflection from the transmissive reflection unit" is properly read as "reflection, diffraction, radiation, or dissipation from the transmissive reflection unit".

In the transmissive reflection unit, when a transmissive reflection film (HR film) is used, the substrate surface has not step, and thus light with a suitable smooth intensity distribution can be reflected as a signal. Further, a transmissive reflection unit other then the transmissive reflection film, for example, a grating, cannot be used when the substrate surface has a step. However, such a transmissive reflection unit can be used in the constitution of the present invention, and thus the present invention has a large advantage. Therefore, in addition to the effect of narrowing the wavelength distribution of optical output, the effect of the transmissive reflection film can also be obtained.

Although the embodiments and example of the present invention have been described above, the embodiment and example of the present invention described above are illustrative only, and the scope of the present invention is not limited to these embodiments. The space of the present invention is described by the claims and includes a meaning equivalent to that in the claims and modifications within the scope of the present invention.

What is claimed is:

1. A semiconductor light emitting device comprising:
a semiconductor laser element emitting a laser beam;
a semiconductor photodiode including a first conductivity type semiconductor layer disposed on a first surface of a first conductivity type semiconductor substrate, a first conductivity type absorption layer disposed on the first conductivity type semiconductor layer to receive the laser beam, a cap layer disposed on the absorption layer, a second conductivity type region formed in the cap layer and the absorption layer, a second electrode in ohmic contact with the second conductivity type region formed in the cap layer, a transmissive reflection unit disposed on a second surface of the semiconductor substrate, and a first electrode in ohmic contact with the first surface opposite to the second surface of the semiconductor substrate; and
a stem on which the semiconductor laser element and the semiconductor photodiode are mounted,
wherein the transmissive reflection unit includes a transmissive reflection film having a reflectance of 50% to 90% for light at a wavelength of 1000 nm to 1700 nm, the semiconductor photodiode is mounted with the cap layer side down, and the transmissive reflection unit is irradiated with the laser beam emitted from one end face of the semiconductor laser element so that the laser beam reflected by the transmissive reflection unit is used as output light, and the laser beam transmitted through the transmissive reflection unit is received by the semiconductor photodiode and used for controlling the output of the semiconductor laser element.

2. The semiconductor light emitting device according to claim 1, wherein the semiconductor substrate is an InP substrate, and the absorption layer is composed of InGaAs or InGaAsP.

3. The semiconductor light emitting device according to claim 1, wherein the transmissive reflection unit includes a multilayer film of a silicon film and a silicon oxide film or an alumina multilayer film.

4. The semiconductor light emitting device according to claim 1, wherein in the semiconductor photodiode, the thickness of the semiconductor substrate is 100 μm to 400 μm, the n-type carrier concentration in the semiconductor substrate is $1E18\ cm^{-3}$ to $1E19\ cm^{-3}$, and the long diameter of a region irradiated with the laser beam is 50 μm to 500 μm.

5. The semiconductor light emitting device according to claim 1, wherein the angle formed by the emission direction of the laser beam of the semiconductor laser and the transmissive reflection unit of the semiconductor photodiode is 30° to 75°.

6. A semiconductor light emitting device comprising:
a semiconductor laser element emitting a laser beam;
a semiconductor photodiode including a first conductivity type semiconductor layer disposed on a first surface of a first conductivity type semiconductor substrate, a first conductivity type absorption layer disposed on the first conductivity type semiconductor layer to receive the laser beam, a cap layer disposed on the absorption layer, a second conductivity type region formed in the cap layer and the absorption layer, a second electrode in ohmic contact with the second conductivity type region formed in the cap layer, a first electrode in ohmic contact with the first conductivity type semiconductor layer, and a transmissive reflection unit disposed on a second surface of the semiconductor substrate; and
a stem on which the semiconductor laser element and the semiconductor photodiode are mounted,
wherein the transmissive reflection unit includes a transmissive reflection film having a reflectance of 50% to 90% for light at a wavelength of 1000 nm to 1700 nm, the semiconductor photodiode is mounted with the cap layer side down, and the transmissive reflection unit is irradiated with the laser beam emitted from one end face of the semiconductor laser element so that the laser beam reflected by the transmissive reflection unit is used as output light, and the laser beam transmitted through the transmissive reflection unit is received by the semiconductor photodiode and used for controlling the output of the semiconductor laser element.

7. The semiconductor light emitting device according to claim 6, wherein the semiconductor substrate is an InP substrate, and the absorption layer is composed of InGaAs or InGaAsP.

8. The semiconductor light emitting device according to claim 6, wherein the transmissive reflection unit includes a multilayer film of a silicon film and a silicon oxide film or an alumina multilayer film.

9. The semiconductor light emitting device according to claim 6, wherein in the semiconductor photodiode, the thickness of the semiconductor substrate is 100 μm to 400 μm, the n-type carrier concentration in the semiconductor substrate is $1E18\ cm^{-3}$ to $1E19\ cm^{-3}$, and the long diameter of a region irradiated with the laser beam is 50 μm to 500 μm.

10. The semiconductor light emitting device according to claim 6, wherein the angle formed by the emission direction of the laser beam of the semiconductor laser and the transmissive reflection unit of the semiconductor photodiode is 30° to 75°.

11. A semiconductor photodiode comprising:
a first conductivity type semiconductor layer formed on a first surface of a first conductivity type semiconductor substrate;
a first conductivity type absorption layer positioned on the first conductivity type semiconductor layer to receive a laser beam;
a cap layer positioned on the absorption layer;
a second conductivity type region formed in the cap layer and the absorption layer;
a second electrode in ohmic contact with the second conductivity type region in the cap layer;
a transmissive reflection unit positioned on a second surface of the semiconductor substrate, wherein the transmissive reflection unit includes a transmissive reflection film having a reflectance of 50% to 90% for light at a wavelength of 1000 nm to 1700 nm; and
a first electrode in ohmic contact with the first surface opposite to the second surface of the semiconductor substrate.

12. A semiconductor photodiode comprising:
a first conductivity type semiconductor layer disposed on a first surface of a first conductivity type semiconductor substrate;
a first conductivity type absorption layer disposed on the first conductivity type semiconductor layer to receive a laser beam;
a cap layer disposed on the absorption layer;

a second conductivity type region formed in the cap layer and the absorption layer;

a second electrode in ohmic contact with the second conductivity type region formed in the cap layer a first electrode in ohmic contact with the first conductivity type semiconductor layer; and a transmissive reflection unit disposed on a second surface of the semiconductor substrate, wherein the transmissive reflection unit includes a transmissive reflection film having a reflectance of 50% to 90% for light at a wavelength of 1000 nm to 1700 nm.

* * * * *